United States Patent
Marker-Villumsen

(10) Patent No.: US 10,033,401 B2
(45) Date of Patent: Jul. 24, 2018

(54) SIGMA-DELTA MODULATOR ARRANGEMENT, METHOD AND CONTROL APPARATUS FOR CALIBRATING A CONTINUOUS-TIME SIGMA-DELTA MODULATOR

(71) Applicant: TDK Corporation, Tokyo (JP)

(72) Inventor: Niels Marker-Villumsen, Måløv (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/554,970

(22) PCT Filed: Apr. 1, 2015

(86) PCT No.: PCT/EP2015/057246
§ 371 (c)(1),
(2) Date: Aug. 31, 2017

(87) PCT Pub. No.: WO2016/155825
PCT Pub. Date: Oct. 6, 2016

(65) Prior Publication Data
US 2018/0048327 A1    Feb. 15, 2018

(51) Int. Cl.
*H03M 3/00*    (2006.01)
(52) U.S. Cl.
CPC .......... *H03M 3/382* (2013.01); *H03M 3/422* (2013.01); *H03M 3/458* (2013.01)
(58) Field of Classification Search
CPC ....... H03M 3/382; H03M 3/422; H03M 3/458
USPC ................................. 341/120–155
See application file for complete search history.

(56) References Cited

U.S. PATENT DOCUMENTS

| | | | |
|---|---|---|---|
| 5,625,317 | A | 4/1997 | Deveirman |
| 6,693,572 | B1 | 2/2004 | Oliaei et al. |
| 7,095,345 | B2 | 8/2006 | Nguyen et al. |
| 7,551,109 | B1 | 6/2009 | Ashmore, Jr. |

(Continued)

FOREIGN PATENT DOCUMENTS

| | | |
|---|---|---|
| EP | 0539684 B1 | 11/1997 |
| WO | 2004/023653 A1 | 3/2004 |

(Continued)

OTHER PUBLICATIONS

PCT Search Report corresponding to co-pending PCT Patent Application No. PCT/EP2015/057246, European Patent Office, dated Jan. 7, 2016; (4 pages).
PCT Written Opinion corresponding to co-pending PCT Patent Application No. PCT/EP2015/057246, European Patent Office, dated Jan. 7, 2016; (9 pages).

(Continued)

*Primary Examiner* — Lam T Mai
(74) *Attorney, Agent, or Firm* — Nixon Peabody LLP

(57) ABSTRACT

A sigma-delta modulator arrangement includes a continuous-time sigma-delta modulator with at least one modulator stage, a digital integrator and a given number of switches. The switches are arranged and configured to convert the continuous-time sigma-delta modulator into a first order incremental sigma-delta analog-to-digital converter comprising the digital integrator. At least a first modulator stage of the continuous-time sigma-delta-modulator, which is coupled with an input of the continuous-time sigma-delta modulator, includes at least one tuning element for adjusting an input signal and/or a feedback signal which are supplied to the first modulator stage.

14 Claims, 6 Drawing Sheets

(56) References Cited

U.S. PATENT DOCUMENTS

Figure 1:
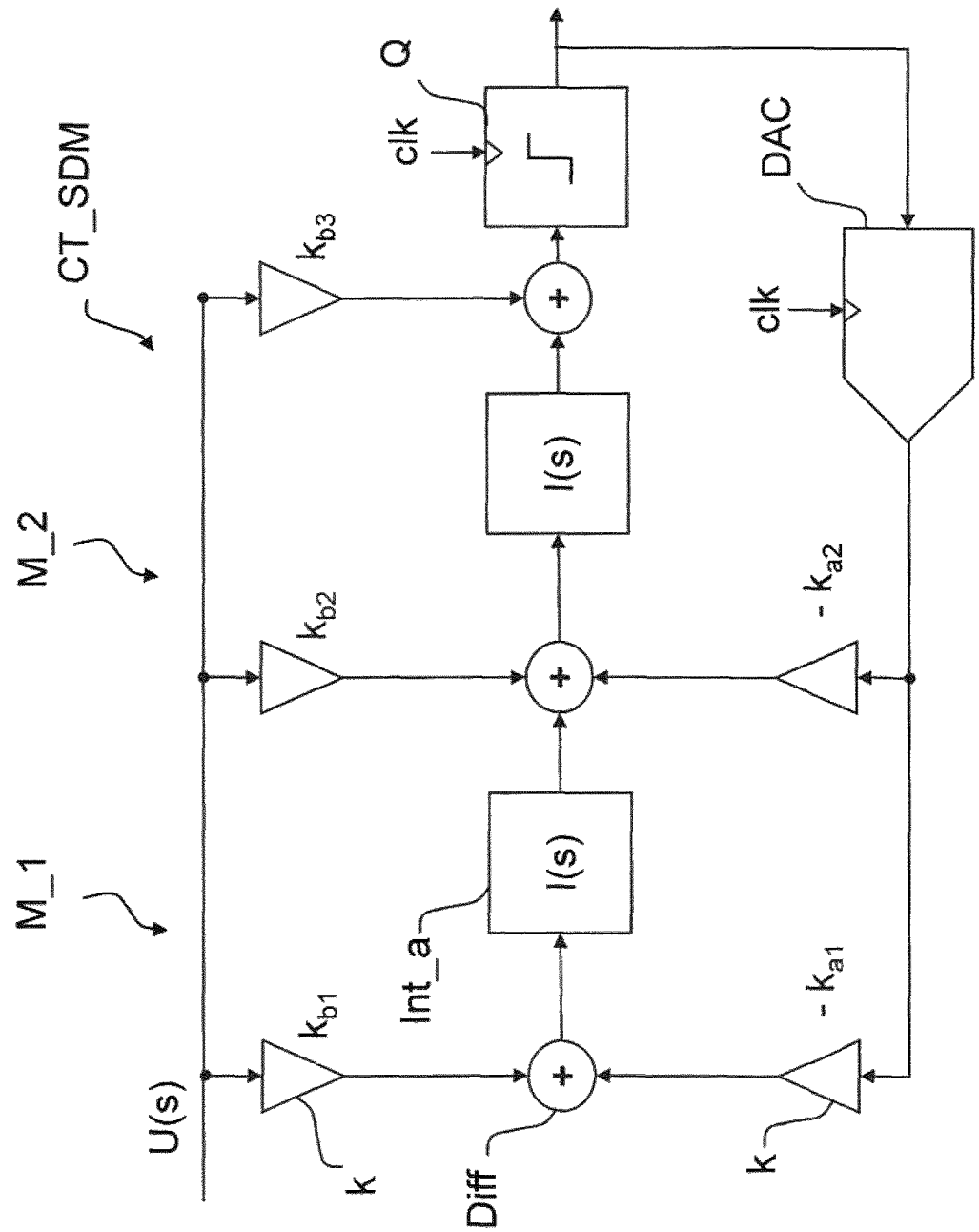

| | | | | |
|---|---|---|---|---|
| 8,031,098 | B1* | 10/2011 | Ebner | H03M 1/1061 |
| | | | | 341/144 |
| 8,046,186 | B2 | 10/2011 | Lim et al. | |
| 8,253,611 | B2* | 8/2012 | Satarzadeh | H03M 3/38 |
| | | | | 341/120 |
| 8,643,518 | B2 | 2/2014 | de Silva et al. | |
| 9,160,356 | B1* | 10/2015 | Kearney | H03M 3/386 |
| 2010/0219997 | A1 | 9/2010 | Le Guillou | H03M 3/386 |
| | | | | 341/143 |
| 2011/0227772 | A1* | 9/2011 | Maurino | H03M 1/005 |
| | | | | 341/143 |
| 2012/0086589 | A1* | 4/2012 | Haroun | H03M 3/344 |
| | | | | 341/119 |
| 2012/0086590 | A1* | 4/2012 | Satarzadeh | H03M 3/38 |
| | | | | 341/120 |
| 2012/0262319 | A1* | 10/2012 | Satarzadeh | H03M 3/38 |
| | | | | 341/120 |
| 2013/0099955 | A1 | 4/2013 | Shaeffer et al. | |
| 2017/0163231 | A1* | 6/2017 | Rombach | H03G 3/301 |

FOREIGN PATENT DOCUMENTS

| | | |
|---|---|---|
| WO | 2005/013483 A2 | 2/2005 |
| WO | 2007/085997 A1 | 8/2007 |

OTHER PUBLICATIONS

Markus, J. et al. "Theory and Applications of Incremental Converters" IEEE Transactions on circuits and systems—I: Regular Papers, vol. 51, Issue 4, 2004, pp. 678-690.

Saxena, S. et al. "Automatic Tuning of Time Constants in Single Bit Continuous-Time Delta-Sigma Modulators" Indian Institute of Technology, Madras. pp. 2257-2260.

* cited by examiner

SIGMA-DELTA MODULATOR ARRANGEMENT, METHOD AND CONTROL APPARATUS FOR CALIBRATING A CONTINUOUS-TIME SIGMA-DELTA MODULATOR

CROSS-REFERENCE TO RELATED APPLICATIONS

This application is a U.S. National Stage of International Application No. PCT/EP2015/057246, filed Apr. 1, 2015, which is incorporated herein by reference in its entirety.

The invention relates to a sigma-delta modulator arrangement comprising a continuous-time sigma-delta modulator. Furthermore, the invention relates to a method and a control apparatus for calibrating a continuous-time sigma-delta modulator. The invention also relates to a system comprising the sigma-delta modulator arrangement and the control apparatus.

Sigma-delta modulators operating as continuous-time modulators, so-called continuous-time sigma-delta modulators, have the advantage of lower power consumption than sigma-delta modulators operating as discrete-time modulators. Alternately, a higher signal bandwidth may be achieved for the signal processing with the same power consumption.

Sigma-delta data converters or noise-shaping oversampling converters are preferred in many analog-to-digital conversion applications. Some applications, e. g. MEMS microphone systems, require a low sensitivity variation of the sigma-delta data converters. For reducing the sensitivity variation of continuous-time sigma-delta modulators due to process variations, generally a tuning of one or more circuit elements of the continuous-time sigma-delta modulators is required.

U.S. Pat. No. 8,643,518 B2 discloses a circuit for calibrating selective coefficients of a delta-sigma modulator. The circuit includes a calibration logic module that is coupled to one of a plurality of stages of the delta-sigma modulator. The calibration logic module measures the oscillating frequency of a respective stage and compares it to a reference frequency. The calibration logic adjusts a selective circuit component associated with the respective stage so that the reference frequency and the oscillating frequency match.

The object of the invention is to provide a sigma-delta modulator arrangement comprising a continuous-time sigma-delta modulator, a calibration method and a corresponding control apparatus and a system, each allowing for easy and/or flexible tuning of the continuous-time sigma-delta modulator.

This object is achieved by the features of the independent claims. Advantageous embodiments of the invention are given in the sub-claims.

According to a first aspect, the invention is distinguished by a sigma-delta modulator arrangement. The sigma-delta modulator arrangement comprises a continuous-time sigma-delta modulator with at least one modulator stage, a digital integrator and a given number of switches. The switches are arranged and configured to convert the continuous-time sigma-delta modulator into a first order incremental sigma-delta analog-to-digital converter comprising the digital integrator. At least a first modulator stage of the continuous-time sigma-delta modulator, which is coupled with an input of the continuous-time sigma-delta-modulator, comprises at least one tuning element for adjusting an input signal and/or a feedback signal, which are supplied to the first modulator stage.

This has the advantage the continuous-time sigma-delta modulator (SDM) may be converted into an incremental sigma-delta modulator allowing for evaluating a change in values of modulator stage coefficients. No external reference signal is needed for the tuning, thus allowing to also carry out the tuning after production of the sigma-delta modulator arrangement. The tuning may be carried out as part of a power-up routine or a wake-up routine after a standby mode. Any type of continuous-time sigma-delta modulator topology, including a modulator order and a number of quantization levels used in the quantizer, may be converted into the incremental sigma-delta analog-to-digital converter allowing for evaluating a change in values of modulator stage coefficients.

According to an embodiment of the first aspect, the sigma-delta modulator arrangement comprises a quantizier element, which is coupled to the continuous-time sigma-delta modulator. The continuous-time sigma-delta modulator and the quantizier element form a continuous-time sigma-delta analog-to-digital converter (ADC). The continuous-time sigma-delta ADC is converted into a first order incremental sigma-delta analog-to-digital converter by coupling an output of the quantizier element with an input of the digital integrator and disconnecting the modulator stages others than the first modulator stage.

This has the advantage that the continuous-time sigma-delta modulator may be easily reconfigured into the incremental sigma-delta analog-to-digital converter with only a very small overhead. A required chip area and a current consumption of the additional circuitry may be very small.

According to a further embodiment of the first aspect, the first modulator stage comprises an active resistor-capacitor-integrator, RC-integrator, with a first resistor in an input path, the first resistor comprising a resistor trim array. This allows for a cost-saving integration of the sigma-delta modulator arrangement and an easy adjustment of an input coefficient and a feedback coefficient of the first modulator stage.

According to a further embodiment of the first aspect, the first modulator stage comprises a transconductor-capacitor-integrator, GmC-integrator, with a transconductance value of the transconductor being trimmable. This allows for a cost-saving integration of the sigma-delta modulator arrangement and an easy adjustment of an input coefficient and a feedback coefficient of the first modulator stage.

According to a further embodiment of the first aspect, the continuous-time sigma-delta modulator comprises at least one further modulator stage comprising at least one further tuning element for adjusting an input signal and/or a feedback signal, which are supplied to the respective modulator stage. In the case that the modulator stages comprise similar structures, this can be advantageously used for reaching a very good matching between the components in an integrated circuit.

According to a second and third aspect, the invention is distinguished by a method and a corresponding control apparatus for calibrating a continuous-time sigma-delta modulator of a sigma-delta modulator arrangement according to the first aspect or to an advantageous embodiment of the sigma-delta modulator arrangement. A first control signal for controlling a switch-setting of the switches of the sigma-delta modulator arrangement is provided such that the continuous-time sigma-delta modulator is converted into the first order incremental sigma-delta analog-to-digital converter comprising the digital integrator. Furthermore a second control signal for controlling the switch-setting of the switches of the sigma-delta modulator arrangement is provided such that a given reference voltage is provided on the input of the first order incremental sigma-delta analog-to-digital converter. A trim control signal is determined dependent on an output signal from the digital integrator, which has been received after a given time span.

The trim control signal is provided for adjusting the tuning element.

Advantageous embodiments of the first aspect are also valid for the second and third aspects.

According to an embodiment of the second and third aspects, it is checked whether the output signal of the digital integrator is in a desired range. If the output signal is not in the desired range, a reset signal for controlling the switch-setting of the switches of the sigma-delta modulator arrangement is provided such that the incremental sigma-delta analog-to-digital converter is reset. Furthermore, a further trim control signal is determined dependent on the output signal form the digital integrator, which has been received after a given time span after providing the reset signal. The above described steps are repeated until the output signal of the digital integrator is in the desired range.

According to a further embodiment of the second and third aspects, a second tuning signal is provided for adjusting the at least one further tuning element of the at least one further modulator stage.

According to a forth aspect, the invention is distinguished by a system comprising a control apparatus according to the third aspect or an advantageous embodiment of the control apparatus, and a sigma-delta modulator arrangement according to the first aspect or an advantageous embodiment of the sigma-delta modulator arrangement. The control apparatus is configured to receive the output signal of the digital integrator. The control apparatus is coupled to the switches of the sigma-delta modulator arrangement to control the switch setting of the switches, and the control apparatus is coupled with each of the tuning elements to control the adjustment of the tuning element or tuning elements.

Advantageous embodiments of the first to third aspects are also valid for the fourth aspect.

Figure 2:
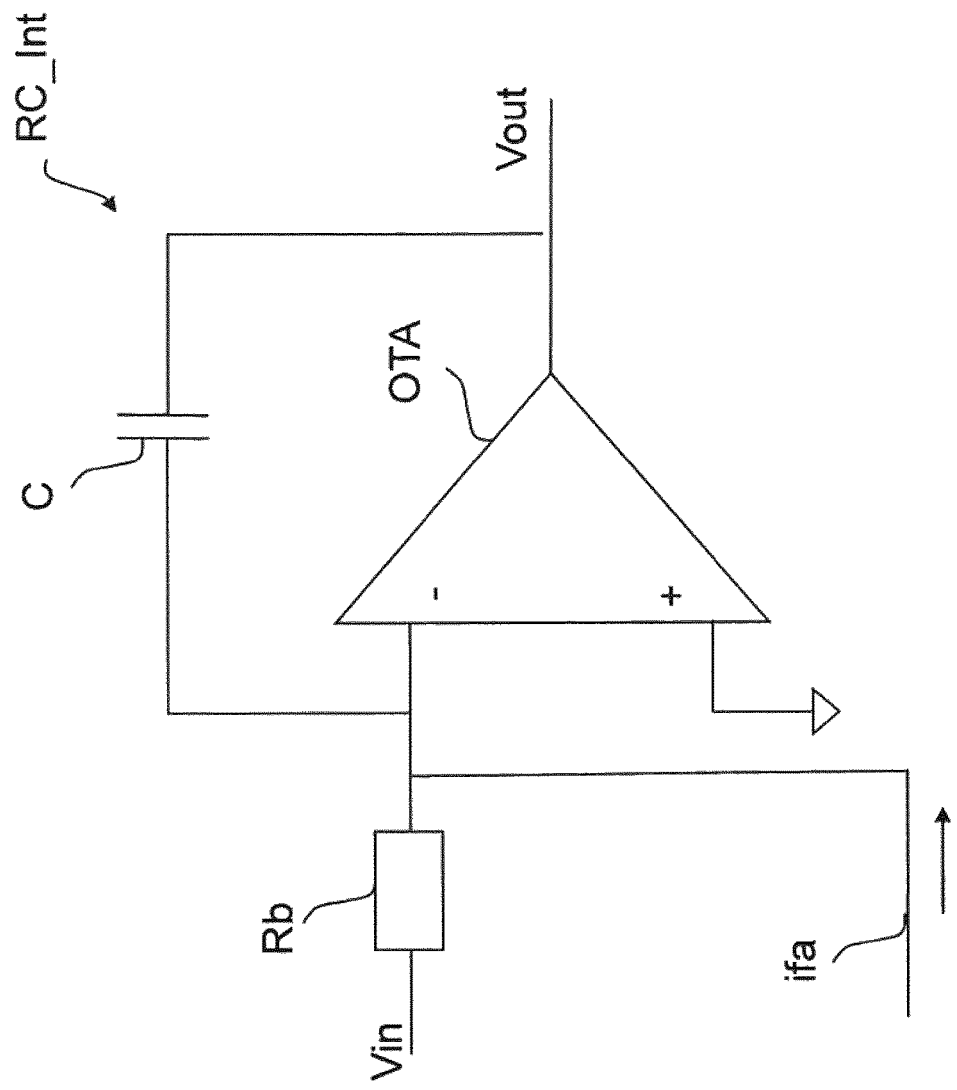
Figure 3:
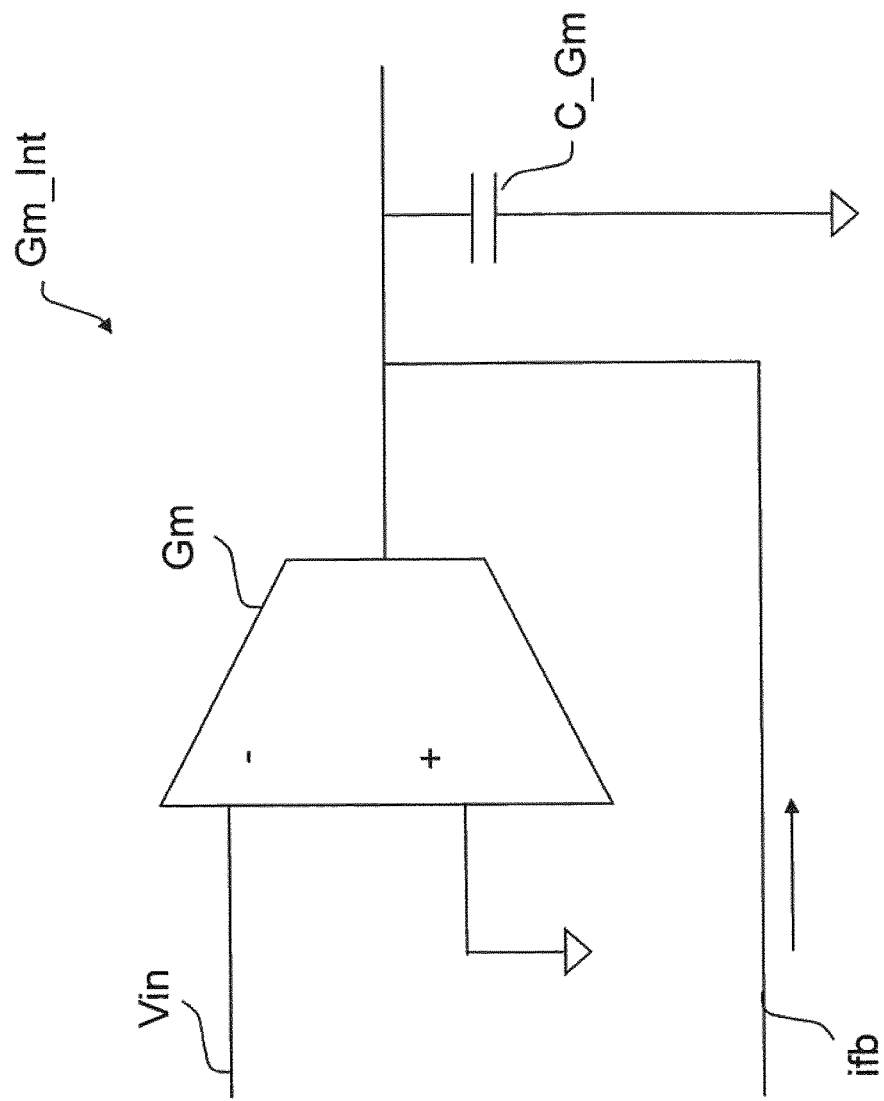
Figure 4:
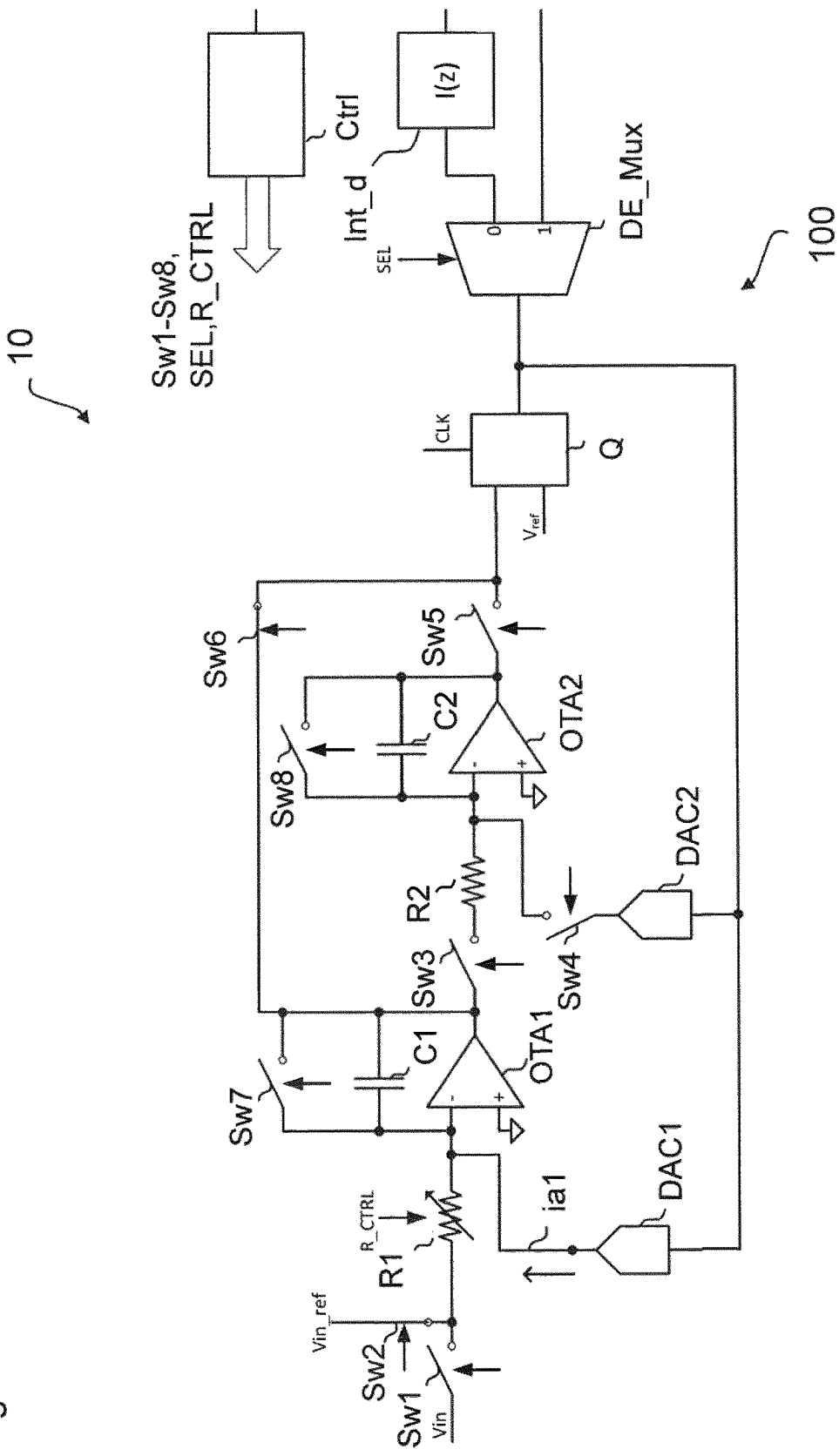
Figure 5:
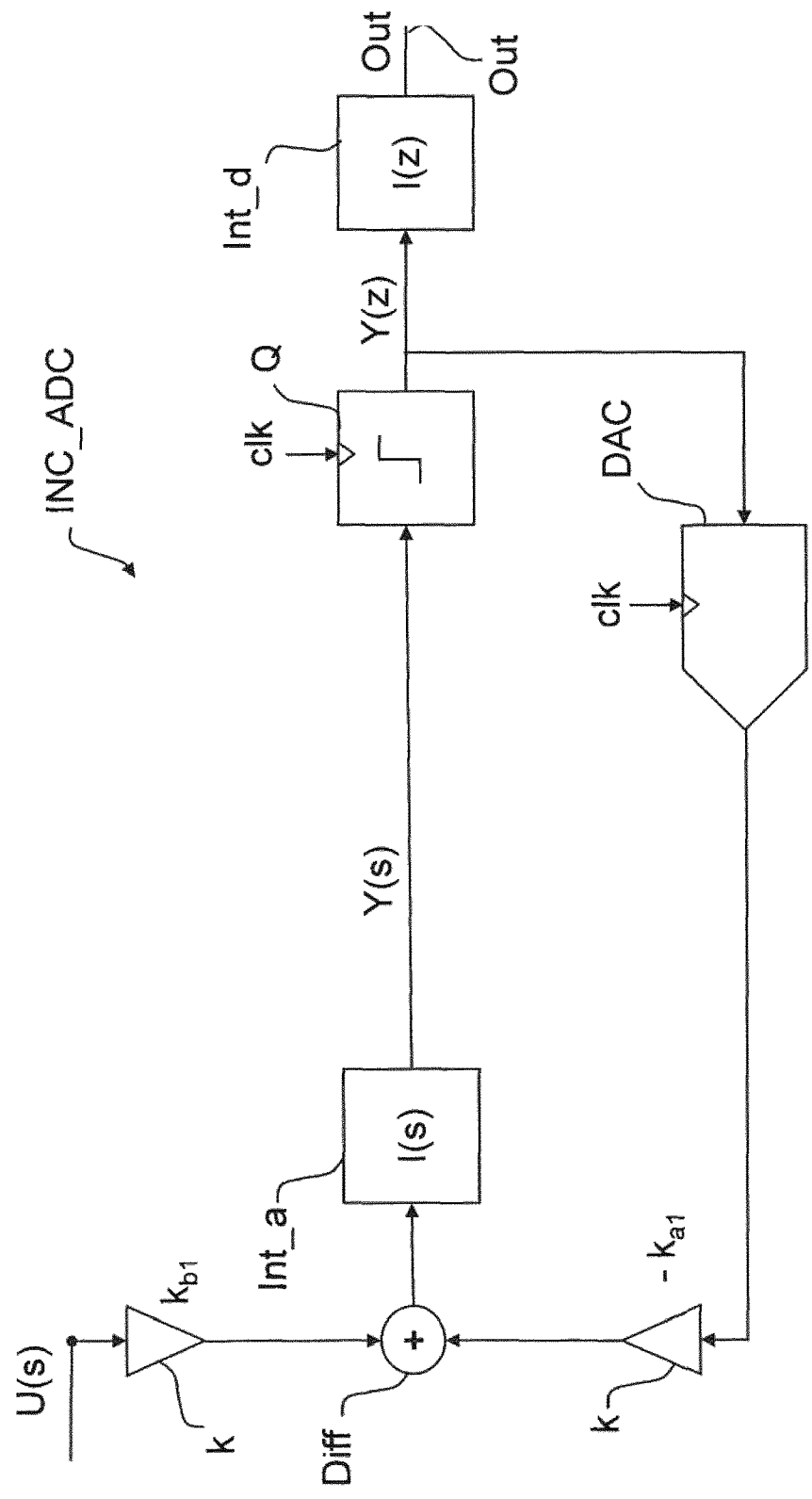
Figure 6:
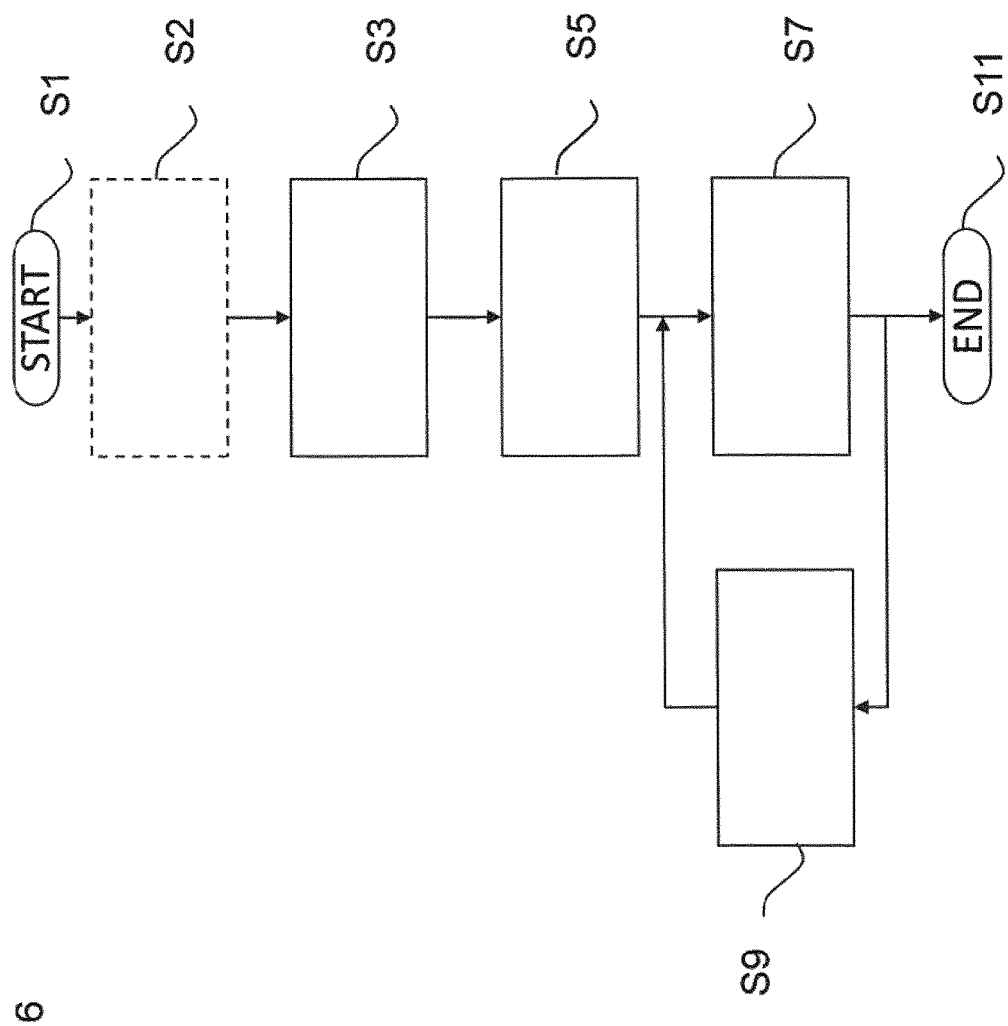

Exemplary embodiments of the invention are explained in the following with the aid of schematic drawings. These are as follows:

FIG. 1 a general form of a continuous-time sigma-delta analog-to-digital converter FIG. 2 an exemplary first device for realizing a first modulator stage, FIG. 3 an exemplary second device for realizing the first modulator stage, FIG. 4 an exemplary system comprising a sigma-delta modulator arrangement, FIG. 5 a general form of a first order incremental sigma-delta analog-to-digital converter and FIG. 6 an exemplary flow chart of a calibration algorithm.

Elements of the same design and function that appear in different figures are identified by the same reference numerals.

FIG. 1 shows a general form of a continuous-time sigma-delta analog-to-digital converter (ADC) comprising a second order continuous-time sigma-delta modulator CT_SDM.

The continuous-time sigma-delta modulator CT_SDM comprises two modulator stages M_1, M_2 each with an analog integrator Int_a, weighting elements k for differently weighting an input signal and a feedback signal. Furthermore the continuous-time sigma-delta modulator CT_SDM comprises a difference element Diff to provide a difference signal of the input signal and feedback signal on an input of the analog integrator Int_a.

Furthermore the continuous-time sigma-delta ADC comprises a clocked quantizier element Q providing a converter output signal on its output and a clocked digital-to-analog converter DAC for providing an analog feedback signal to the input of the respective modulator stages M_1, M_2.

A sensitivity of the continuous-time sigma-delta ADC equals a signal gain of the continuous-time sigma-delta ADC in a signal band of interest. This in turn relates to an input coefficient and a feedback coefficient of the respective weighting elements k of the first modulator stage M_1.

For the shown continuous-time sigma-delta ADC, a signal transfer function (STF) at small frequencies compared to a sampling frequency, i. e. s ≈0, can be found from a linear model of the continuous-time sigma-delta ADC to $$STF(0)=k_{b1}/k_{a1}$$

wherein $k_{b1}$ is the input coefficient and $k_{a1}$ is the feedback coefficient of the first modulator stage M_1.

A signal gain of 1 requires that $k_{b1}$ equals $k_{a1}$. Thus, any mismatch between $k_{b1}$ and $k_{a1}$ will result in non-unity signal gain in the continuous-time sigma-delta ADC.

FIG. 2 shows an exemplary first device for realizing the first modulator stage M_1 of the continuous-time sigma-delta modulator CT_SDM.

The first modulator stage M_1 comprises an active RC-integrator. Preferably, the active RC-integrator comprises an operational-transconductance-amplifier OTA. In the depicted version of the active RC-integrator, the input coefficient $k_{b1}$ is realized by a resistor Rb and a capacitor C, while the feedback coefficient $k_{a1}$ is realized by a current ifa and the capacitor C.

When fabricating the continuous-time sigma-delta ADC as an integrated circuit, a variation in absolute value due to process variations may be different for the resistor Rb and a current source providing the current ifa. The current source is generated, for example, by a bandgab reference and a current source resistor. This current source resistor may have different process variations than a resistor type of the resistor Rb used in the active RC-integrator.

Therefore, after fabrication of the continuous-time sigma-delta ADC, it is necessary to match the current ifa and the resistor Rb in order to achieve a desired sensitivity of the continuous-time sigma-delta ADC.

FIG. 3 shows an exemplary second device for realizing the first modulator stage M_1 of the continuous-time sigma-delta modulator CT_SDM.

The second device comprises a transconductor-capacitor integrator (GmC-integrator). Here a feedback signal comprises a current ifb while an input signal Vin comprises a voltage that is converted to a current signal using a transconductor Gm.

In the depicted version of the GmC-integrator GmC_Int, the input coefficient $k_{b1}$ is realized by the transconductor Gm and a transconductor-output capacitor C_Gm, while the feedback coefficient $k_{a1}$ is realized by a feedback current ifb and the transconductor-output capacitor C_Gm.

In this case the transconductance value of the transconductor Gm may be tuned to match the feedback current ifb.

FIG. 4 shows an example of a system 10 comprising a sigma-delta modulator arrangement 100 with a continuous-time sigma-delta modulator CT_SDM and a control apparatus Crtl for calibrating the continuous-time sigma-delta modulator CT_SDM.

The continuous-time sigma-delta modulator CT_SDM comprises a first modulator stage M_1 and a second modulator stage M_2. Alternatively, the sigma-delta modulator device may comprise only a single stage or more than two stages.

The sigma-delta modulator arrangement 100 comprises a quantizier element Q, which is coupled to the continuous-time sigma-delta modulator CT_SDM. The continuous-time sigma-delta modulator CT_SDM and the quantizier element Q form a continuous-time sigma-delta analog-to-digital converter.

The first modulator stage M_1 comprises at least one tuning element for adjusting the input signal of the first modulator stage and/or the feedback signal of the first modulator stage.

For instance, the switches Sw1 to Sw6 of the sigma-delta modulator arrangement 100 are used to configure an operation of the sigma-delta modulator arrangement 100. A first input Sw1 switch and a second input switch Sw2 are used for providing a given reference voltage to the input of the incremental sigma-delta ADC INC_ADC during a tuning mode. A first and a second resetting switch Sw7, Sw8 are used for resetting the integrators by shorting the respective integration capacitors C1, C2.

States of switches Sw1 to Sw8 and a select signal SEL for the different operation modes of the sigma-delta modulator arrangement 100 are listed in the table below.

The sigma-delta arrangement shown in FIG. 4 optionally comprises a demultiplexer DE_Mux, which is controlled by the select signal SEL. In this case the demultiplexer DE_Mux comprises a switch function.

TABLE 1

| | | | | Switching states | | | | | |
|---|---|---|---|---|---|---|---|---|---|
| Mode | Sw1 | Sw2 | Sw3 | Sw4 | Sw5 | Sw6 | Sw7 | Sw8 | SEL |
| Normal | Closed | Open | Closed | Closed | Closed | Open | Open | Open | 1 |
| Tuning | Open | Closed | Open | Open | Open | Closed | Open | Open | 0 |
| Reset | Don't care | Don't care | Don't care | Don't care | Don't care | Don't care | Don't closed | Don't closed | Don't care |

The first modulator stage M_1 comprises, for example, a first integrator module with a first operational-transconductance-amplifier OTA1, a first resistor R1 and a first integration capacitor Cl. Preferably, the first resistor R1 is configured such that a resistance value of the first resistor R1 is tunable in a given range for adjusting the input signal.

Furthermore the first modulator stage comprises a first digital-analog converter DAC1. An input of the first digital-analog converter DAC1 is coupled with an output of the quantizier element Q. The first resistor R1 comprises, for instance, a resistor trim array.

The second modulator stage M_2 comprises, for example, a second integrator module with a second operational-transconductance-amplifier OTA2, a second input resistor R2 and a second integration capacitor C2. Furthermore the second modulator stage comprises a second digital-analog converter DAC2. An input of the second digital-analog converter DAC2 is coupled with the output of the quantizier element Q.

The quantizier element Q is configured to compare an input signal of the quantizier element Q with at least one given reference signal.

The sigma-delta modulator arrangement 100 comprises a digital integrator Int_d. An input of the digital integrator Int_d is coupleable with the output of the quantizier element Q.

Additionally, the sigma-delta modulator arrangement 100 comprises a given number of switches Sw1, . . . ,Sw8 which are arranged and configured to convert the continuous-time sigma-delta modulator CT_SDM into a first order incremental sigma-delta analog-to-digital converter INC_ADC comprising the digital integrator Int_d.

In particular, the sigma-delta modulator arrangement 100 comprises the given number of switches Sw1, . . . ,Sw8 which are arranged and configured such that the second modulator stage or, in the case of a higher order sigma-delta modulator all stages except for the first modulator stage, may be bypassed and an output of the first modulator stage may be directly coupled with an input of the quantizier element Q.

The control apparatus Crtl is configured to receive a provided output signal of the digital integrator Int_d.

The control apparatus Crtl may be integrated on a same chip as the sigma-delta modulator arrangement 100. Alternatively the control apparatus Crtl may be configured as a separate unit or as a unit partly integrated on the same chip. The control apparatus Crtl may comprise a state-machine. A hardwired look-up table may be used to determine the correct tuning The control apparatus Crtl is configured to control a calibration of the continuous-time sigma-delta modulator CT_SDM of the sigma-delta arrangement.

A substantial benefit of the sigma-delta modulator arrangement 100 is that it is not necessary to have a secondary circuit with the same resistors and capacitors. An amount of added digital circuitry may be only a digital integrator comprising an adder and a register, both of the same bitwidth and a state machine for controlling the tuning. The bitwith of the adder depends on desired precision of the continuous-time sigma-delta modulator ADC.

FIG. 5 shows a general form of the first order incremental sigma-delta analog-to-digital converter INC_ADC.

When applying a known DC signal to the input of the incremental sigma-delta ADC INC_ADC, and after running a given amount of clock cycles, the output value of the incremental sigma-delta ADC INC_ADC can be compared to a known output value that equals the output for when $k_{b1}=k_{a1}$.

The precision of the conversion done by the incremental sigma-delta ADC INC_ADC depends on the number of cycles that are integrated and the noise of the quantizer element and circuit blocks. For a first order single-bit incremental sigma-delta ADC the achieved bits of resolution, from quantization alone, is equal to log 2 to the number of samples integrated.

FIG. 6 shows an embodiment of a calibration algorithm. In the following, the algorithm will be described in more detail. The algorithm may be implanted as a program.

For instance the program starts in a step S1. The calibration algorithm may be part of a power-up routine or a wake-up routine after a standby mode. It may also be carried out after production with the tuning mode setting programmed in a one-time programmable (OTP) memory.

Preferably, in an optional step S2 a nominal setting of the resistor trim array of the first resistor R1 is carried out by providing a given nominal trim control signal. The nominal setting could be any of the possible settings of the trim array.

In a step S3 a first control signal is provided for controlling a switch-setting of the switches Sw1, . . . ,Sw8 of the sigma-delta modulator arrangement 100 such that the continuous-time sigma-delta modulator CT_SDM is converted into a first order incremental sigma-delta ADC INC_ADC.

To tune, for instance, the values of the resistor trim array of the first resister R1, the sigma-delta modulator arrangement 100 is configured in a tuning mode, as shown in FIG. 4. In this configuration the first integrator is connected directly to an input of the quantizier element Q, while the second integrator is disconnected. The first integrator is reset by shortly closing the first resetting switch Sw7 and opening it again before starting the incremental sigma-delta ADC INC_ADC operation. The digital integrator Int_d is also digitally reset.

In a step S5 a second control signal is provided for controlling the switch-setting of the switches Sw1, . . . , Sw8 of the sigma-delta modulator arrangement 100 such that a given reference voltage is provided on the input of the first order incremental sigma-delta ADC INC_ADC.

For example, as shown in FIG. 4, the first input switch Sw1 is opened and the second input switch Sw2 is closed.

In a step S7 a trim control signal is determined dependent on an output signal from the digital integrator Int_d, which has been received after a given time span. The trim control signal is provided on an output of the control apparatus Crtl. Subsequently, the resistor trim array of the first resistor R1 is adjusted according to the trim control signal.

Preferably, the trim control signal is determined dependent on an output value provided by the digital integrator Int_d after N clock cycles. For example, the incremental sigma-delta ADC INC_ADC, after applying the reference voltage on its input, runs for a given time span. After the given time span, e. g. after N clock cycles, the output value from the digital integrator Int_d is captured and compared with a given reference value or reference range. If the found value is above the reference value or range, the value of the first resistor R1 is increased. If the found value is below the reference value or range, the value of the first resistor R1 is decreased.

After having adjusted the resistor trim array setting of the first resistor R1, the incremental sigma-delta ADC INC_ADC is reset in a step S9 and a new measurement is carried out using the same input reference voltage.

For instance, after having adjusted the resistor trim array setting of the first resistor R1, the incremental sigma-delta ADC INC_ADC is reset by closing the first reset switch Sw7 and opening it again just before starting the incremental sigma-delta modulator operation again. The digital Integrator Int_d is also reset.

This process continues until the incremental sigma-delta ADC output value is in a desired range. When this is the case, the tuning algorithm ends in a step S11. The sigma-delta modulator arrangement 100 enters the reset mode to reset the integration capacitors C1, C2. Next it is configured into the normal mode and the normal operation of the circuit starts.

Preferably the nominal setting is the setting at which the resistance of the resistor trim array equals the intended resistance in the typical process corner. In this case, the number of necessary measurements and adjustments of the resistor trim array is expected to be minimized, assuming that the resistor value of the resistor trim array in this nominal setting equals the mean value of the statistical distribution that describes the variation of the resistor values due to process variations.

After setting the initial value of the resistor trim array, a reference signal is applied to the input of the incremental sigma-delta ADC INC_ADC, and after N clock cycles, where N is an integer number, e.g. 64, the output value is measured.

Based on the wanted ratio between the loopfilter coefficients kb1 and ka1, as shown in FIG. 1, that are realized by the first resistor R1 and the current ia1 of the first modulator stage, the input reference signal and the wanted tuning precision, an upper and a lower limit of incremental sigma-delta ADC output values is used to determine if the first resistor R1 has been tuned to the current ia1 within the wanted precision. In this example of the tuning algorithm, the incremental sigma-delta ADC output value is first compared to the upper limit. If the output value is above this upper limit, the resistor trim array is adjusted in order to increase the resistance of the first Resistor R1, which should decrease the ratio kb1/ka1 towards the wanted value.

If the incremental sigma-delta ADC output value is below the upper limit, the output value is then, in a next step, compared to the lower limit. If it is below this lower limit, the resistor trim array is adjusted in order to reduce the resistance of the first resistor R1, which should increase the ratio kb1/ka1 towards the wanted value.

If the measured incremental sigma-delta ADC output value is either above the upper range limit or below the lower range limit, after having adjusted the resistor trim array setting, the incremental sigma-delta ADC INC_ADC is reset and a new measurement is carried out using the same input reference voltage.

This process continues until the incremental sigma-delta ADC output value is both below the upper range limit and above the lower range limit. When this is the case, the tuning algorithm ends.

In another embodiment, the resistor trim array of the first resistor R1 is nominally set to the minimum resistor value setting. Then the measurement starts in the same manner as the above described algorithm embodiment. However, only a single limit value is necessary, as it is only necessary to determine whether the incremental sigma-delta ADC output value is below the upper limit.

Similarly, in another embodiment, the resistor trim array of the first resistor R1 is nominally set to the maximum resistor value setting. The measurement starts in the same manner as the above described algorithm embodiment. Again, only a single limit value is necessary, as it is only necessary to determine whether the incremental sigma-delta ADC output value is above the lower limit.

In both of these alternative examples, the worst case number of iterations in the algorithm is equal to the number of settings for the resistor trim array. In the first described example, the number of iterations is minimized if the nominal value is set to the middle resistor trim array setting. In that case the maximum number of iterations is only equal to half the number of settings.

More complicated search algorithms may be used, e.g. based on Divide and Conquer methods. However, the complexity of these algorithms may increase the amount of digital logic needed to implement the tuning algorithm.

REFERENCE NUMERALS 10 system
100 sigma-delta modulator arrangement

C capacitor of RC-integrator
C_Gm transconductor-output capacitor
C1 first integration capacitor
C2 second integration capacitor
Crtl control apparatus
CT_SDM continuous-time sigma-delta modulator
DAC digital-to-analog converter
DAC1 first digital-analog converter
DAC2 second digital-analog converter
DE_Mux demulitplexer
Diff difference element
Gm transconductor
ifa current of RC-integrator
ifb current of GmC-integrator
INC_ADC incremental sigma-delta ADC
Int_a analog integrator
Int_d digital integrator
k weighting element
M_1, M_2 first and second modulator stage
OTA operational-transconductance-amplifier
OTA1 first operational-transconductance-amplifier
OTA2 second operational-transconductance-amplifier
Out output signal of the digital integrator
Q quantizier element
R1 first resistor
R2 second resistor
Rb resistor of RC-integrator
RC_int RC-integrator
S1 to S9 processing steps
Sw1 to Sw8 switches
Vin input signal

The invention claimed is:

1. A sigma-delta modulator arrangement comprising:
a continuous-time sigma-delta modulator with a first modulator stage and at least one further modulator stage,
a digital integrator and
a given number of switches, which are arranged and configured to convert the continuous-time sigma-delta modulator into a first order incremental sigma-delta analog-to-digital converter comprising the digital integrator,
wherein the first modulator stage of the continuous-time sigma-delta modulator, which is coupled with an input of the continuous-time sigma-delta modulator comprises at least one tuning element for adjusting an input signal and/or a feedback signal which are supplied to the first modulator stage.

2. The sigma-delta modulator arrangement according to claim 1, wherein the sigma-delta modulator arrangement comprises a quantizier element, which is coupled to the continuous-time sigma-delta modulator, the continuous time sigma-delta modulator and the quantizier element forming a continuous-time sigma-delta analog-to-digital converter, ADC, and wherein the continuous-time sigma-delta ADC is converted into a first order incremental sigma-delta analog-to-digital converter by coupling an output of the quantizier element with an input of the digital integrator and disconnecting the modulator stages others than the first modulator stage.

3. The sigma-delta modulator arrangement according to claim 1, wherein the first modulator stage comprises an active resistor-capacitor-integrator, RC-integrator, with a first resistor in an input path, the first resistor comprising a resistor trim array.

4. The sigma-delta modulator arrangement according to claim 1, wherein the first modulator stage comprises a transconductor-capacitor-integrator, with the transconductance value of the transconductor being trimmable.

5. The sigma-delta modulator arrangement according to claim 1, wherein the at least one further modulator stage comprises at least one further tuning element for adjusting an input signal and/or a feedback signal which are supplied to the respective modulator stage.

6. A method for calibrating a continuous-time sigma-delta modulator of a sigma-delta modulator arrangement, the sigma-delta modulator comprising:
a continuous-time sigma-delta modulator with a first modulator stage and at least one further modulator stage,
a digital integrator and
a given number of switches, which are arranged and configured to convert the continuous-time sigma-delta modulator into a first order incremental sigma-delta analog-to-digital converter comprising the digital integrator,
wherein the first modulator stage of the continuous-time sigma-delta modulator, which is coupled with an input of the continuous-time sigma-delta modulator comprises at least one tuning element for adjusting an input signal and/or a feedback signal which are supplied to the first modulator stage,
the method comprising the steps of:
providing a first control signal for controlling a switch-setting of the switches of the sigma-delta modulator arrangement such that the continuous-time sigma-delta modulator is converted into the first order incremental sigma-delta analog-to-digital converter comprising the digital integrator,
providing a second control signal for controlling the switch-setting of the switches of the sigma-delta modulator arrangement such that a given reference voltage is provided on the input of the first order incremental sigma-delta analog-to-digital converter,
determining a trim control signal dependent on an output signal from the digital integrator, which has been received after a given time span,
providing the trim control signal for adjusting the tuning element.

7. The method according to claim 6, wherein the method further comprises the steps of:
a) checking whether the output signal of the digital integrator is in a desired range and, if the output signal is not in the desired range,
b) providing a reset signal for controlling the switch-setting of the switches of the sigma-delta modulator arrangement such that the incremental sigma-delta analog-to-digital converter is reset,
c) determining a further trim control signal dependent on the output signal from the digital integrator, which has been received after a given time span after providing the reset signal, and
d) repeating steps a) to c) until the output signal of the digital integrator is in the desired range.

8. The method according to claim 6, wherein the at least one further modulator stage comprises at least one further tuning element for adjusting an input signal and/or a feedback signal which are supplied to the respective modulator stage and wherein the method further comprises: providing a tuning signal for adjusting the at least one further tuning element of the at least one further modulator stage.

9. Control apparatus for calibrating a continuous-time sigma-delta modulator, wherein the control apparatus is configured to execute a method according to claim 7.

10. The sigma-delta modulator arrangement according to claim 2, wherein the first modulator stage comprises an active resistor-capacitor-integrator, RC-integrator, with a first resistor in an input path, the first resistor comprising a resistor trim array.

11. The sigma-delta modulator arrangement according to claim 2, wherein the first modulator stage comprises a transconductor-capacitor-integrator, GmC-integrator, with the transconductance value of the transconductor being trimmable.

12. The sigma-delta modulator arrangement according to claim 2, wherein the continuous-time sigma-delta modulator comprises at least one further modulator stage comprising at least one further tuning element for adjusting an input signal and/or a feedback signal which are supplied to the respective modulator stage.

13. The sigma-delta modulator arrangement according to claim 3, wherein the continuous-time sigma-delta modulator comprises at least one further modulator stage comprising at least one further tuning element for adjusting an input signal and/or a feedback signal which are supplied to the respective modulator stage.

14. The sigma-delta modulator arrangement according to claim 4, wherein the continuous-time sigma-delta modulator comprises at least one further modulator stage comprising at least one further tuning element for adjusting an input signal and/or a feedback signal which are supplied to the respective modulator stage.

* * * * *